(12) United States Patent
Samuel et al.

(10) Patent No.: US 6,967,437 B1
(45) Date of Patent: Nov. 22, 2005

(54) LIGHT EMITTING DIODE WITH IMPROVED EFFICIENCY

(75) Inventors: Ifor David William Samuel, Durham (GB); John Mark Lupton, Durham (GB); Benjamin James Matterson, Durham (GB); William Leslie Barnes, Exeter (GB); Martin Guy Salt, Exeter (GB)

(73) Assignees: University of Durham, Durham (GB); University of Exeter, Exeter (GB)

( * ) Notice: Subject to any disclaimer, the term of this patent is extended or adjusted under 35 U.S.C. 154(b) by 0 days.

(21) Appl. No.: 09/926,494

(22) PCT Filed: May 12, 2000

(86) PCT No.: PCT/GB00/01748

§ 371 (c)(1),
(2), (4) Date: Feb. 11, 2002

(87) PCT Pub. No.: WO00/70691

PCT Pub. Date: Nov. 23, 2000

(30) Foreign Application Priority Data

May 12, 1999 (GB) .................................. 9910901

(51) Int. Cl.[7] .................. H01L 51/20; H01L 33/00; H05B 33/00
(52) U.S. Cl. ............... 313/506; 313/498; 313/512; 427/66; 257/40; 257/89; 257/99; 362/800
(58) Field of Search ........................ 313/498, 501, 313/503–507, 108 R, 512; 445/23–25; 257/88, 257/89, 98, 40, 70, 99, 104; 385/8, 9, 14; 427/59, 66; 362/800

(56) References Cited

U.S. PATENT DOCUMENTS

| 3,739,217 | A |   | 6/1973 | Bergh et al. |
| 4,080,245 | A |   | 3/1978 | Yamanaka et al. |
| 4,856,014 | A |   | 8/1989 | Figueroa et al. |
| 5,405,710 | A | * | 4/1995 | Dodabalapur et al. ...... 428/690 |
| 5,804,919 | A | * | 9/1998 | Jacobsen et al. ............ 313/506 |
| 6,060,826 | A | * | 5/2000 | Ueda et al. .................. 313/498 |
| 6,133,692 | A | * | 10/2000 | Xu et al. ..................... 313/506 |
| 6,140,764 | A | * | 10/2000 | Xu et al. ..................... 313/504 |
| 6,278,237 | B1 | * | 8/2001 | Campos ...................... 313/512 |
| 6,362,566 | B2 | * | 3/2002 | Xu et al. ..................... 313/501 |
| 6,441,551 | B1 | * | 8/2002 | Abe et al. .................... 313/503 |
| 6,476,550 | B1 |   | 11/2002 | Oda |
| 6,504,180 | B1 | * | 1/2003 | Heremans et al. ............ 257/98 |

FOREIGN PATENT DOCUMENTS

| JP | 11-283751 | 10/1999 |
| WO | 98/25313 | 6/1998 |
| WO | 98/25314 | 6/1998 |

OTHER PUBLICATIONS

M.G. Salt et al., "Photonic band gaps in guided modes of textured metallic microcavities", Optics Communications, Vo. 166 (1-6), 22, Feb. 1999, pp. 151-162, (Abstract Only).

(Continued)

*Primary Examiner*—Ashok Patel
(74) *Attorney, Agent, or Firm*—Jacobson Holman PLLC

(57) ABSTRACT

An LED, and in particular an LED employing emissive semi-conductors such as conjugated polymeric materials, consists of a pair of electrodes, one or more intermediate semi-conductor layers arranged therebetween and optionally one or more futher layers, and incorporates a microstructured feature adapted to manipulate spontaneous emission or propagation of light. The invention also consists of a method for the production of such an LED and the use of such a LED as an light emitting display.

33 Claims, 8 Drawing Sheets

OTHER PUBLICATIONS

B. J. Matterson et al., "Effect of Lateral Microstructure on Conjugated Polymer Luminescence", International Conference On Science and Technology of Synthetic Metals, Montpellier, France, Jul. 12-18, 1998, vol. 101, No. 1-3, pp. 250-251, XP-000931170.

Shanhui Fan et al., "high Extraction Efficiency of Spontaneous Emission from Slabs of Photonic Crystals", Physical Review Letters, Apr. 28, 1997, vol. 79, No. 17, pp. 3294-3297, XP-000931171.

R. Windisch et al., "Light-emitting diodes with 31% external quantum efficiency by outcoupling of lateral waveguide modes", Applied Physics Letters, Apr. 19, 1999, vol. 74, No. 16, pp. 2256-2258, XP002145910.

D.G. Lidzey et al., "Control of photoluminescence emission from a conjugated polymer using an optimised microcavity structure", Chemical Physics Letters 263, Dec. 20, 1996, pp. 655-660.

M.G. Salt et al., "Photonic band gaps in guided modes of textured metallic microcavities", Optics Communications, Vo. 166 (1-6), Feb. 22, 1999, pp. 151-162, (Abstract Only).

M. D. McGehee et al., "Semiconducting polymer distributed feedback lasers", Applied Physics Letters, Mar. 30, 1998, vol. 72, No. 13, pp. 1536-1538.

A. Kock et al., "Strongly directional emission from AlGaAs/ GaAs light-emitting diodes", Appl. Phys. Lett., vol. 57 (22), Nov. 26, 1990, pp. 2327-2329.

T. Yamasaki et al., "Spontaneous emission from fluorescent molecules embedded in photonic crystals consisting of polystyrene microsphere", Appl. Phys. Lett., vol. 72, No. 16, Apr. 20, 1998, pp. 1957-1959.

* cited by examiner

LIGHT EMITTING DIODE WITH IMPROVED EFFICIENCY

BACKGROUND OF THE INVENTION

The present invention relates to novel light emitting diodes (hereinafter LEDs), components and uses thereof, to a process for the production thereof and a method for light emission. More particularly the present invention relates to novel organic LEDs adapted for improved efficiency light emission, and provides a way of controlling the polarisation and spectrum of the emitted light. It relates to uses of such devices in light-emitting displays including LCDs (Liquid Crystal Displays) and the like, to a process for the production thereof and a method for light emission.

The invention has applications in light-emitting displays, such as for calculators, clocks, mobile phones, computers, information display and elsewhere. It may be used in a display in which a pattern of LEDs is employed or alternatively as a backlight for an LCD. Many further applications will be apparent to the reader familiar with LED technology and include use as an electroluminescent screen, as a light source, lit control button and the like.

SUMMARY OF THE INVENTION

Light emission from materials can occur as a result of optical or electrical stimuli. The former process is known as photoluminescence and the latter process is known as electroluminescence. Both processes are well known in a wide range of semiconductors. Electroluminescence occurs in LEDs.

LEDs are semiconducting electronic devices in which the injection of negative and positive charges (known in the art as electrons and holes respectively) leads to the emission of light from the device. The light-emitting material may be organic or inorganic.

An LED may consist of several layers or regions adapted for charge injection, charge transport, and light-emission. Each layer or region may be an organic or inorganic material.

Semiconducting inorganic LEDs are known, employing inorganic semiconducting materials for all the above charge transporting and light-emitting purposes. Light-emission occurs at a junction between p-type and n-type doped semiconducting regions. Inorganic semiconductors are generally crystalline materials with complicated (but well-established) manufacturing procedures. Gallium compounds and alloys are commonly used.

An organic light emitting diode (LED) consists of one or more organic layers adapted for charge transport and/or light-emission sandwiched between two charge injecting electrodes, of which one is usually transparent.

Both polymers and small conjugated organic molecules are suitable as constituent layers for organic LEDs. Examples of suitable polymers include poly(p-phenylenevinylene) (PPV) and derivatives such as poly[2-methoxy, 5-2'-ethyl-hexyloxy)-1,4-phenylene vinylene] (MEH-PPV), polyfluorene and polypyridine. Examples of suitable small organic molecules include metal chelates such as aluminium trisquinolate ($Alq_3$). The work functions of the electrodes are adapted for the injection of charge into the organic layers. Materials with relatively high work function such as indium tin oxide (ITO) or gold are suitable for hole injection, and ITO is particularly convenient because of its transparence. Materials with low work function are commonly selected for electron injection, such as aluminium, calcium, lithium, magnesium, alloys and admixtures thereof.

A simple organic LED can be made by spin-coating a polymer such as MEH-PPV onto an ITO-coated substrate followed by evaporation of a top metal contact. It is also known that organic layers can be deposited successfully by printing.

The operation of an LED involves many steps: charge injection, charge transport, recombination of opposite charges, light emission, and light escape from the device. The efficiency of an LED (which can be defined as the number of photons emitted divided by the number of charges passing through the device) depends on the fraction of injected charges which recombine with an opposite charge, the fraction of resulting recombination processes which generate light, and the fraction of the light generated in the device which escapes from the device.

In general, the light emitted from LEDs is unpolarised. However, for some applications, notably backlighting of LCDs, a source of polarised light is desirable.

A serious problem with LEDs is the trapping of light emitted by the emissive layer in waveguide modes within the substrate. This may reduce the overall external device efficiency dramatically. For example in the case of organic LEDs it has been proposed that only a fraction $1/2n^2$ of the light generated inside the LED escapes from it, where n is the refractive index of the organic layer (Angular Dependence of the Emission from Conjugated Polymer Light-emitting Diode: Implications for Efficiency Calculations, N. C. Greenham. Adv. Mat. 1994, 6, No 6).

Taking a refractive index of 2 (typical of a conjugated polymer such as PPV) would imply that seven eighths of the light generated inside the device is trapped there, and only one eighth escapes. In inorganic semiconductors the same considerations apply and refractive indices are higher (a typical value is 3.5). It has been estimated that only 3% of the light generated in a planar LED will escape (see for example D. Wood, Optoelectronic Semiconductor Devices, Prentice Hall, Hemel Hempstead. 1994, page 86).

The present invention provides a novel way of improving LED performance by increasing and controlling the light coupling out of the device.

It is important to appreciate that the invention concerns the adaptation of LEDs for improved efficiency light emission, and for enabling control of the polarisation and spectrum of the emitted light. LED devices operate by spontaneous emission of radiation, in contrast to lasers which operate by stimulated emission of radiation with spatial and temporal coherence of the emitted light, a threshold current for light emission, and (usually) single-wavelength operation. LEDs are generally much simpler, cheaper and more robust than lasers, and any adaptation of LEDs for improved efficiency should therefore be similarly simple, cheap and robust.

Emissive species embedded in the emissive layer of an LED structure emit their energy into the available modes of the structure, these modes include: radiative modes, the ones that produce useful radiation; trapped guided modes, including waveguide modes and surface plasmon polariton modes associated with the metal contacts. In addition, emissive species (emitters) may lose their energy via non-radiative decay, for example resulting in the generation of phonons.

The different radiative modes are characterised by their frequency and in-plane wavevector. Modes having in-plane wavevectors less than free space photons of the same frequency may escape the LED structure and are responsible for the useful radiation from planar LEDs. Modes having a higher wavevector are not able to radiate into free space, these radiative modes are thus trapped (waveguided) in the layers that comprise the LED structure. These latter trapped modes may carry the majority of the energy.

Various attempts have been made to raise external device efficiency by macro-roughening the exit surface by which light leaves the device (for example U.S. Pat. No. 3,739,217 and U.S. Pat. No. 4,080,245). Random roughening of surfaces has been shown to increase light output (R. Windisch et al. Applied Physics Letters, 74 (1999) 2256–7258).

Other methods of raising efficiency are the provision of internal channels and/or microcavities (U.S. Pat. No. 4,856,014. Control of photoluminescence emission from a conjugated polymer using an optimised microcavity structure, D. G. Lidzey et al. Chemical Physics Letter 263 (1996) 655–660).

However, there still exists a need to improve the efficiency of light emission of an LED. Furthermore, none of the above approaches gives any control over the polarisation of the emitted light. We have now surprisingly found that it is possible to provide a semiconducting LED meeting these requirements in admirable manner.

We have also surprisingly found that the present invention gives some control of the spectrum of emitted light, and improves the electrical characteristics of the LED such that light emission starts at a lower voltage.

In its broadest aspect there is provided according to the present invention a light emitting diode (LED), comprising an electrode adapted for electron injection, a second opposing electrode adapted for hole injection, one or more intermediate semi-conductor layers arranged therebetween and optionally one or more further layers wherein the device comprises at least one microstructured feature adapted to manipulate spontaneous emission or propagation of light.

The microstructured feature is suitably comprised as part of an intermediate layer, an electrode, and/or a further layer such as a surface layer which may for example be an external "cladding" layer or the like. It will be apparent that the manipulation may therefore be effective at any stage in the generation, propagation or emission of light in order to modify the properties of light emitted such as intensity, polarisation or spectrum.

The microstructured feature as hereinbefore defined may be of any form adapted to control emission and preferably comprises a substantially periodic microstructure which is effective in controlling intensity, polarisation or spectrum of the emitted light.

Without being limited to this theory, we have found that the invention provides in novel and surprising manner a mechanism by which the above requirements are met which may be in the form of Bragg scattering from substantially periodic microstructure.

The main advantages of periodic microstructure in an LED are increased efficiency, increased brightness, increased total light output, improved polarisation purity of the emitted radiation and control of the spectral variation of the emitted radiation with emission angle, as explained hereinafter.

Guided modes produced by emission from the emitters in the structure are Bragg scattered by the microstructure to produce useful radiation from the device. In this way light that would otherwise have been trapped in the emissive layer is, at least in part, recovered thus improving efficiency.

Through Bragg scattering the microstructure changes the in-plane wavevector of the guided modes. The wavevector of trapped waveguide modes may be decreased, allowing these modes to radiate. However, radiative modes may have their wavevector increased, thus trapping them in the structure. The net result is a surprising improvement in efficiency because, as we have demonstrated, the microstructure enables more energy to be scattered out of the device than it traps.

The emission radiated from planar LED devices is in general un-polarised. With the addition of microstructure, much of the emitted radiation results from the extraction of waveguide modes by the Bragg scattering process. The polarised nature of the waveguided modes and the vectoral nature of the Bragg scattering process by which they are coupled to useful radiation means that periodic microstructure can be used to control the polarisation state of the emitted radiation.

As a further result of the Bragg scattering process, the frequency of the radiation emitted in a given direction is dictated by the profile of the microstructure. Consequently, the spectral variation of the radiated output with emission angle may be controlled. The microstructured layers can consist of many regions of different periodicity to couple out light of different colours.

In addition to the uses of periodic microstructure mentioned hereinbefore, periodic microstructure can be used to modify the nature of the waveguided modes supported by the LED structure. By controlling the microstructure incorporated into the LED structure, in particular the periodicity thereof, the microstructure can be used to control the nature of the guided modes that the LED structure may support. This in turn allows greater control over the radiation emitted by the LED as follows.

Periodic microstructure, in addition to providing Bragg scattering to allow the extraction of waveguide modes, also results in the an alteration of the photonic band structure supported by layered structures [M. G. Salt and W. L. Barnes, "Photonic Band Gaps in Guided Modes of Textured Metallic Microcavities" Accepted for publication by Optics Communications. (accepted April 1999).]

In particular, Bragg scattering of waveguide modes may be used to produce band gaps in the propagation of these modes. The frequency of the centre of this gap and its width (in frequency) are dictated by the profile of the microstructured interfaces together with the dielectric properties of the materials from which the layers that comprise the LED are made.

Additionally, because of the vector nature of the Bragg scattering process, the central frequency of the gap depends on the in-plane propagation direction of the waveguide mode. Importantly, if the frequency of the emission from the emitters embedded in the LED structure lies in the photonic band gap for a particular in-plane direction, the emitters are unable to generate waveguide modes propagating in that direction. Conversely, if the frequency of the emission from the emitters embedded in the LED structure lies at one of the edges of the photonic band gap for a particular in-plane direction, the generation of waveguide modes propagating in that direction is enhanced.

Suitable tailoring of the photonic band-structure of the LED through appropriate periodic microstructure thus allows for the preferential excitation of a desired waveguide mode. This may allow for an additional increase in efficiency over and above that due to extracting guided modes by Bragg scattering. The higher mode density associated with a mode at the edge of a photonic band gap further enhances the overall efficiency of the device by ensuring that emission by the emitters into waveguide modes preferentially produces waveguide modes that propagate in an in-plane direction that the microstructure is able to couple to useful radiation.

An additional benefit of this increased efficiency is that there is an associated increase in the decay rate of emission from the emitters, owing to the flattened photonic bands. This may prove advantageous when high modulation rates are required, or emitters suffering from significant non-radiative decay are to be used. Further, by preferentially enhancing the emission from the emitters into waveguide modes propagating in selected in-plane directions, additional improvements in the polarisation purity of the emitted radiation can be achieved, over and above that due to extracting guided modes by Bragg scattering.

Reference herein to a layer is to a substantially uniform discrete layer of a material, the properties of which are suited to the function of the layer. Accordingly, it will be apparent that individual layers are distinguished by nature of configuration or component material, which may comprise one or a plurality of chemical entities present as a physical or chemical mixture. The electrodes may form an entire layer of the LED or may be present as discrete areas within a layer or on the surface of the LED.

Preferably, at least one semiconducting layer or a component thereof, is capable of light emission by luminescence. Preferably, the emissive layer(s) or component thereof are substantially coincident with the junction of coincidence of charge carriers. More preferably the or each semiconducting layer is substantially emissive.

Reference herein to electrons and holes is to negative and positive charge carriers respectively, as known in the art, also known as negative and positive polarons.

Reference herein to microstructure is to a structure having features and/or properties characterised by a small scale, such as microscopic. Features may be in the form of physical structuring, such as corrugation. Properties may be in the form of micro variations in refractive index by composition variation, ion implantation or other methods and the like. Preferably, the microstructure is of microscopic scale.

Reference herein to substantially periodic microstructure is to microstructure at least one section of which has a substantially regular period. The periodicity of the microstructure may be uniform throughout or the microstructure may have sections with differing periodicity. Both of these may form a pattern or array.

The microstructure may have any suitable period or range of periods of features and/or properties to give the effect of improved efficiency. Preferably, the period is of microscopic scale. More preferably, the period is in the order of 50–2000 nanometers, more preferably between 100 and 600 nm. In one preferred embodiment the period is between 350 and 450 nm and ideally 400 nm.

Preferably the microstructure is solid such that any or all microstructured layers are continuous, that is, do not comprise any form of perforation containing no material or a material of appreciably lower optical density within their structure.

The microstructure is preferably generally lateral, that is, extends in a substantially parallel plane to the semiconducting layer and/or further layers and/or LED structure. The microstructure may be present in any lateral extent of the defined layers or electrodes. For example, it may extend over substantially all of the microstructured layer(s) or electrode(s), a substantial part thereof or a small part thereof. Preferably, the microstructure extends over a substantial part thereof, more preferably over substantially all thereof.

The microstructured layer(s) and/or electrode(s) may extend in any lateral extent of the LED structure. Preferably, they extend over substantially all of the LED structure.

A device as hereinbefore defined may comprise any further layers of the LED, such as supporting, sealing, protective or conductive layers and the like. The microstructure may be present in any or all of these further layers. Its presence may be related to the method of fabrication or selected by other criteria.

The microstructured layer(s) and or electrodes(s) may comprise a microstructure on one or both surfaces thereof or the microstructure may extend throughout the device. Preferably, the microstructure provides the entirety of at least one of the microstructured layers and/or electrodes. This has advantages of ease of manufacture in view of the low thickness of the LED layers (of the order of 20–100 nm), which complicates physical manipulation within the layer or of one surface of the layer only.

Preferably, the microstructure acts as a diffraction grating. This can be created by properties or structures as hereinbefore defined.

In one preferred embodiment the microstructure comprises features in the form of physical structuring, preferably corrugation. Preferably the corrugation is in the form of one or more non-planar surfaces or layers and comprises an array of opposed projecting portions. The projections may be of any desired shape, such as sinusoidal, rectangular, jagged, pointed or the like.

The array may give, for example, a sinusoidal, square or other wave form of the layer or surface such that each projecting portion extends laterally across the layer (sometimes known as one-dimensional corrugation). Alternatively, the array may be cross-corrugated to give a dimpled form of the surface such that a projecting portion is surrounded by opposed projecting portions (sometimes known as two- or multi-directional corrugation).

The corrugation may be of any suitable depth to improve efficiency. Preferably, the depth between peaks and troughs is of the order 5 to hundreds of nanometers. More preferably it is between 10 and 200 nm, even more preferably between 20 and 120 nm.

The corrugation is preferably in the entirety of the layer. The thickness of a semiconducting layer in an organic LED is of the order of 100 mm. Surprisingly we have found that at the preferred depths of corrugation, the electrical and emission properties of the semiconducting layer are not detrimentally affected, despite the high ratio of corrugation depth to layer depth, which is close to 1:1.

Where the microstructure comprises modified refractive index., the portions of the layer with modified refractive index are present within the layer and are in the form of lines or areas of modified refractive index laterally across the layer. The refractive index profile in the plane of the layer modified by such microstructure may take the form of, for example, a sinusoidal, square or other waveform of the refractive index.

For organic LEDs, an electrode as hereinbefore defined adapted for electron injection is suitably comprised of any suitable electron injecting material for example as known in the art, preferably comprises any suitable metal, alloy or semi-conductor such as aluminium, lithium-aluminium, calcium or magnesium-silver, magnesium, magnesium-aluminium and the like optionally as an alloy or admixture with suitable agents.

An electrode as hereinbefore defined adapted for hole injection is suitably comprised of any suitable hole injecting material for example as known in the art, preferably comprises any suitable metal, alloy or semi-conductor such as indium tin oxide (ITO), tin oxide or other transparent conductor, PEDOT, polyaniline or like polymer, gold and the like, optionally as an admixture with suitable agents.

A semiconducting layer as hereinbefore defined may comprise any organic (including organometallic) or inorganic semiconducting material. Preferably it comprises organic material such as small organic molecules, such as aluminium trisquinolate (Alq3), metal chelates and the like, polymers or mixtures thereof. In a preferred embodiment, the material comprises a polymer, preferably a conjugated polymer, for example PPV and derivatives such as poly(2-methoxy, 5-(2'-ethylhexyloxy)-p-phenylene vinylene) (MEH-PPV), or polyfluorene. Conjugated polymers combine good transport properties with strong luminescence and simple processing.

Other suitable semiconductor layers include compounds and alloys of gallium. Particularly preferred inorganic semiconducting materials are gallium arsenide and gallium nitride, and other like compound semiconducting materials which will suggest themselves to those skilled in the semiconducting art.

A device as hereinbefore defined may comprise any further supporting, sealing or protective layers and the like. Preferably a device as hereinbefore defined comprises a transparent rigid or flexible support layer such as quartz or glass or suitable synthetic equivalent such as polymeric substrates on which the device is constructed or onto which the constructed device is transferred, whereby the integrity and uniformity thereof is preserved. A first support layer may be used during the construction of the device, onto which either outer layer may be deposited as desired, and intermediate and opposing layers subsequently applied, and a second support layer to be used during use applied to either outer layer as desired. Any of these layers may be microstructured by any suitable means.

In a further aspect of the invention there is provided the novel use of a semiconducting organic layer with lateral microstructure in a device as hereinbefore defined.

In a further aspect of the invention there is provided the use of a device as hereinbefore defined as a light emitting display of any desired surface area and for portable or fixed purpose. A display may comprise a single continuous device or a mosaic of devices depending on the size and nature thereof.

Preferably a device is used for display purposes, such as electroluminescent TV or computer screens, back lighting of liquid crystal displays such as in watches and the like, very large area displays such as public information boards in airports and the like, small displays such as for household electrical goods including calculators, washing machines and the like, flexible displays, head-up (virtual reality) displays for training, entertainment purposes and the like, for example for aircraft pilot, road user training and the like; for improved efficiency applications such as for lighting of large areas, preferably by means of panelled low intensity (low brightness) wall or ceiling lighting in place of a plurality of independent lights, lighting powered by a battery source such as car brake lights, lighting in constant use such as traffic lights, warning and or road signs which may be optionally flashing or otherwise active, visible or near infra red security lighting.

Preferably a device as hereinbefore defined comprises or is adapted to be associated with means for mounting and operation thereof in known manner.

Devices may be used in AC or DC operation, with the hereinbefore mentioned advantages of efficiency, brightness, control of polarisation and spectrum. The increased efficiency reduces power consumption, which is of particular benefit in battery-powered equipment.

In a further aspect of the invention there is provided a method for the production of a device as hereinbefore defined. The device may suitably be produced by any technique as known in the art with the additional step of producing a microstructure as hereinbefore defined. The method steps are those necessary to produce the device as hereinbefore defined.

Preferably a device as hereinbefore defined is produced by providing a first support layer of desired dimensions and laminating or coating this with successive layers. Preferably, metallic layers are deposited by thermal evaporation, electrolytic or reactive means.

Preferably an organic semiconducting layer as hereinbefore defined is coated in a layer for example by means of spin coating, dip-coating, printing, evaporation or epitaxial growth.

The microstructure as hereinbefore defined may be produced by any suitable method, such as embossing, photolithography, microcontact printing or laser holography. The microstructured layer(s) and/or electrode(s) may alternatively be deposited on a microstructured substrate or microstructured contact (e.g. ITO).

In one preferred embodiment features, for example corrugations, are created by exposing a photoresist or other farther layer to at least one laser beam and subsequently depositing the semi-conducting layer and optionally further layers directly or indirectly onto the featured layer.

Preferably, the layer is exposed to an interference pattern created by a plurality of laser beams, preferably two laser beams.

Preferably, the layer is then cured where appropriate and is also preferably coated (preferably by spin coating) with further layers.

In one preferred embodiment, the microstructure is then transferred from the photoresist layer to the substrate upon which it is supported, typically the transparent support to the LED structure.

In a further aspect of the invention there is provided a method for the operation of an LED as hereinbefore defined. Suitably an LED as hereinbefore defined is operated in known manner, by applying a voltage, causing a current to flow through the device. Advantageously a device as hereinbefore defined may be conveniently and reliably operated by virtue of the high efficiency thereof.

BRIEF DESCRIPTION OF THE DRAWINGS

The invention is now illustrated in non-limiting manner with reference to the following figures and examples.

PREFERRED EMBODIMENT

In the following, the manufacture, testing and key results of a solution processed single layer polymer LED with lateral microstructure is described. Firstly, the device structure is electrically stable, which is counter-intuitive due to the ratio of corrugation height to overall device thickness. It is found that the device efficiency is increased by a factor of 3 to 4, the emission spectrum is significantly altered with the vibronic structure (i.e. the peaks of the characteristic emission) appearing sharper. Also, the emitted light is polarised, which is an extremely significant observation.

(i) Fabrication of the grating

The corrugation of lateral pitch 400 nm was made by exposing the photoresist to the interference of two laser beams. The first step was to spin the photoresist (Shipley S1805) onto silica substrates to give films of thickness 500 nm. The samples were then exposed to the interference pattern of two laser beams, generated using an Argon ion laser operating at 457.9 mm. Following exposure, the samples were developed, exposed to UV radiation (245 nm), and baked in air at up to 240° C. The samples of corrugated photoresist were characterised by measurements of angle-dependent reflectivity and also by atomic force microscopy (AFM). These measurements confirmed the lateral period of 400 nm, but showed some sample to sample variation in grating depth. The peak to trough depth of grating determined by AFM was typically 80 mm.

(ii) Polymer LED structure

Figure 1:
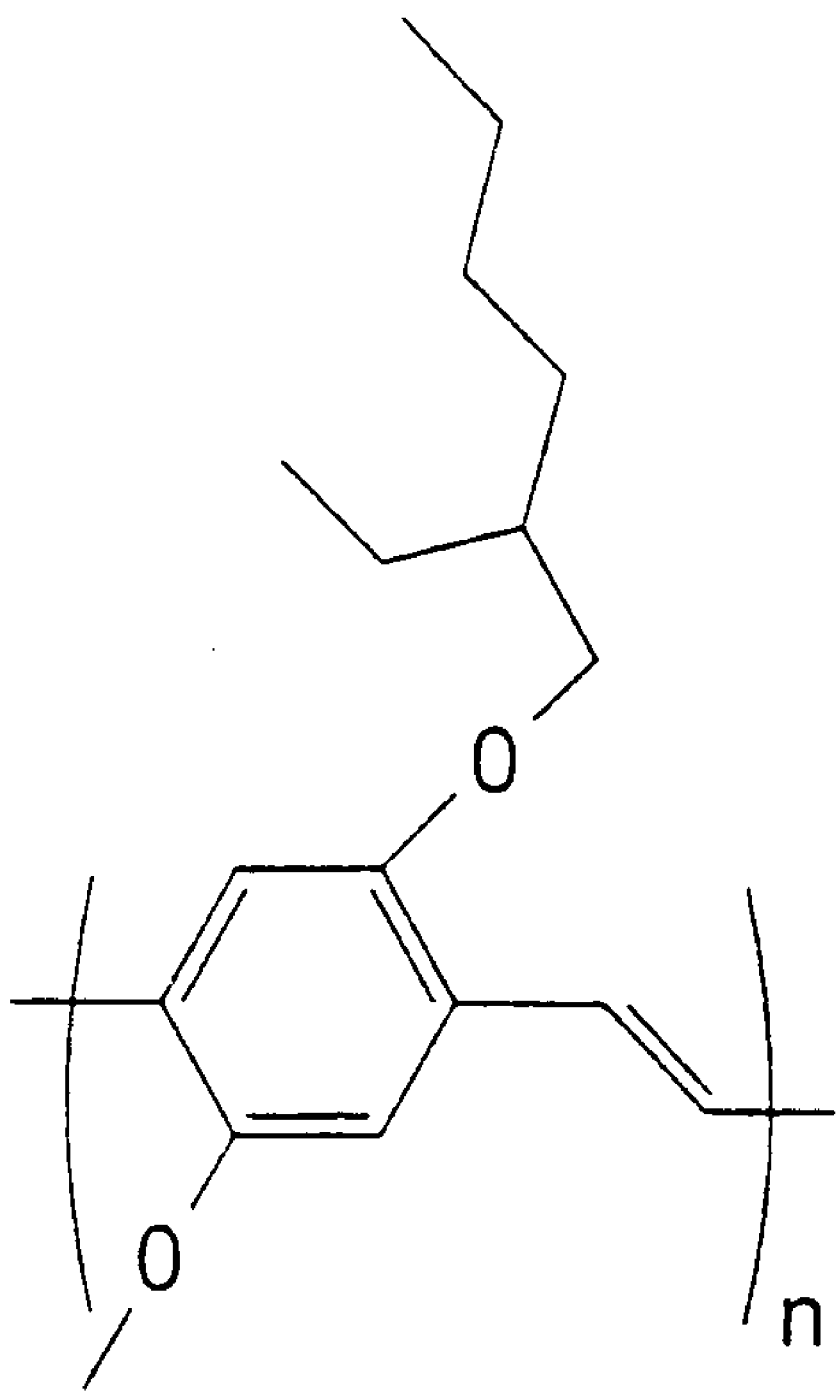
FIG. 1 is a solution processed single layer polymer electroluminescent (EL) device.

The device structure studied is a solution processed single layer polymer electroluminescent (EL) device containing the polymer MEH-PPV as the emissive layer. The structure is show in FIG. 1.

Figure 2:
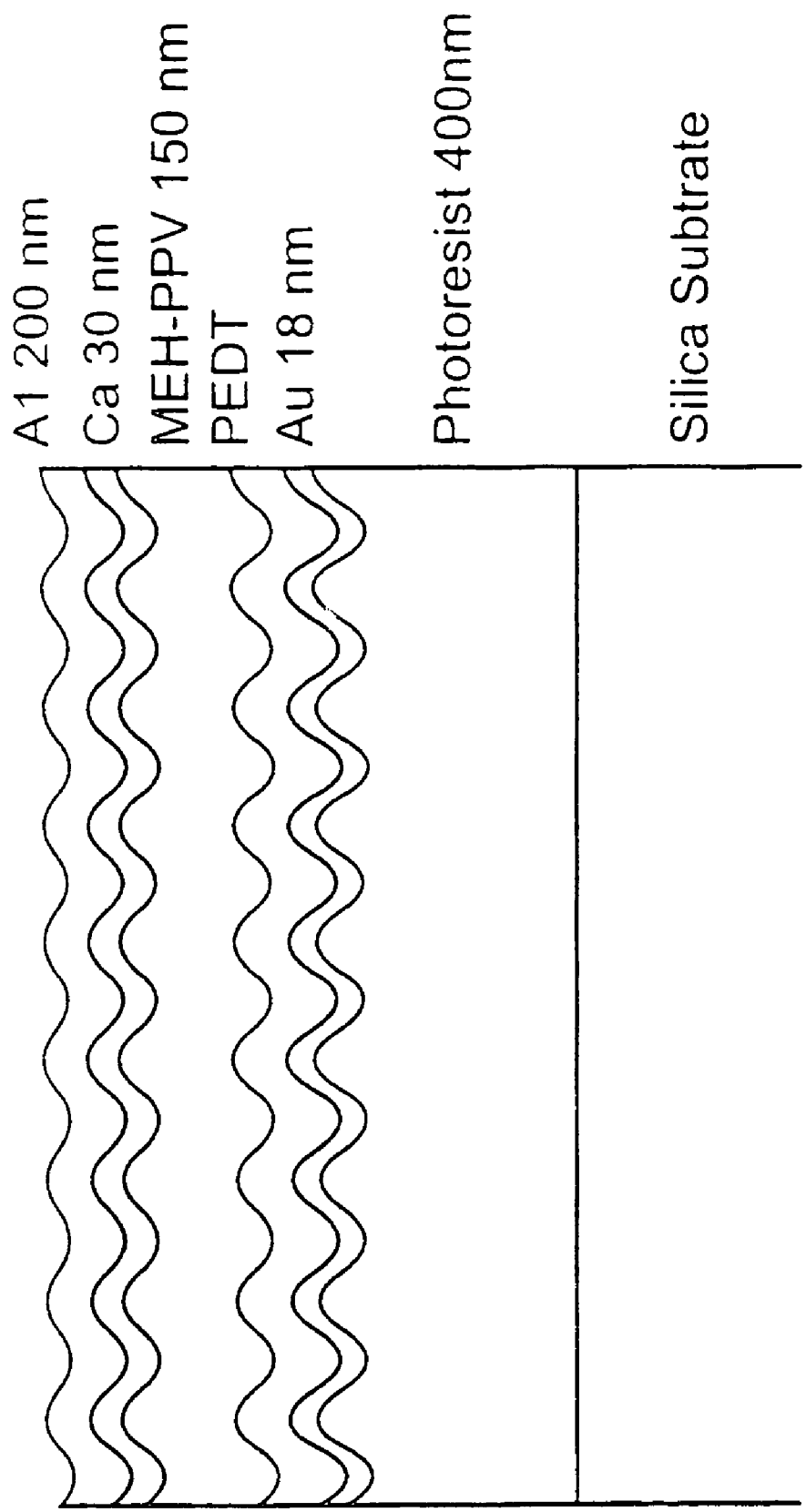
FIG. 2 is a cross-section showing the vertical layer structure of the LED structure.

A cross section showing the vertical layer structure of a device is in FIG. 2. Although all of the layers are shown with microstructure, this is dependent on the fabrication parameters and not necessary for functioning of the device.

As the photoresist is insulating, it is necessary to deposit a conducting anode on top of the photoresist. Gold has a work function comparable to ITO and has previously been used as a hole injecting contact (anode). A useful, i.e. relatively low absorption, gold layer should not be thicker than 20 nm and can be as thin as 8 nm. A layer of polyethylenedioxythiophene (PEDOT), which is a commercially available conductive polymer (Bayer AG, Germany), is deposited on top of the gold layer by spin-coating, and then baked for ten hours at 50° C. in vacuo. PEDOT is transparent in the visible and hence has no effect on the emission spectrum. The emissive layer of MEH-PPV is then spin-coated onto the PEDOT layer. Under a vacuum of $5 \times 10^{-6}$ mbar a thin calcium electrode is deposited which is capped by a thick aluminium electrode to prevent oxidation. Light is emitted through the silica substrate.

Figure 3A:
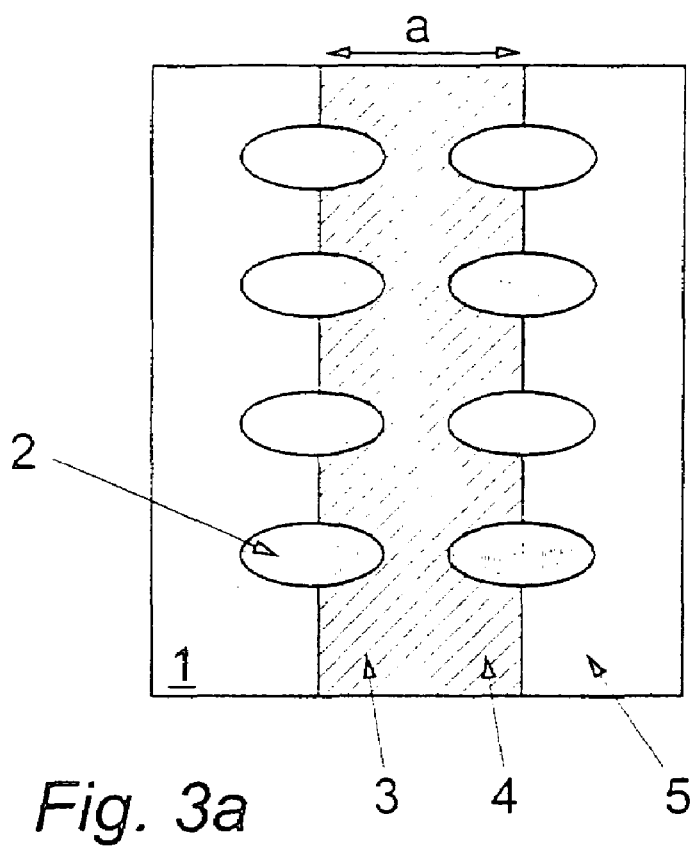
FIGS. 3a and 3b depict a completed device structure.
Figure 3B:
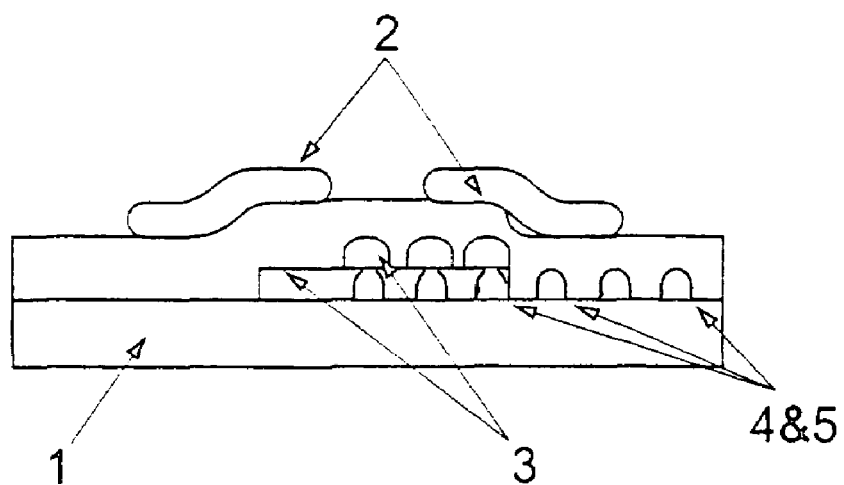

The completed device structure in this example is shown in FIGS. 3A and 3B. The structure is built upon a substrate 1 and has a central portion "a" with intermediate layers 3 therein. The device has eight pixels 2 which may be addressed individually. The grating 4, 5 only covers one half of the substrate 1, so that the other half of the substrate can be used as a direct comparison of both emission and spectrum and efficiency.

(iii) Device characteristics

Figure 4:
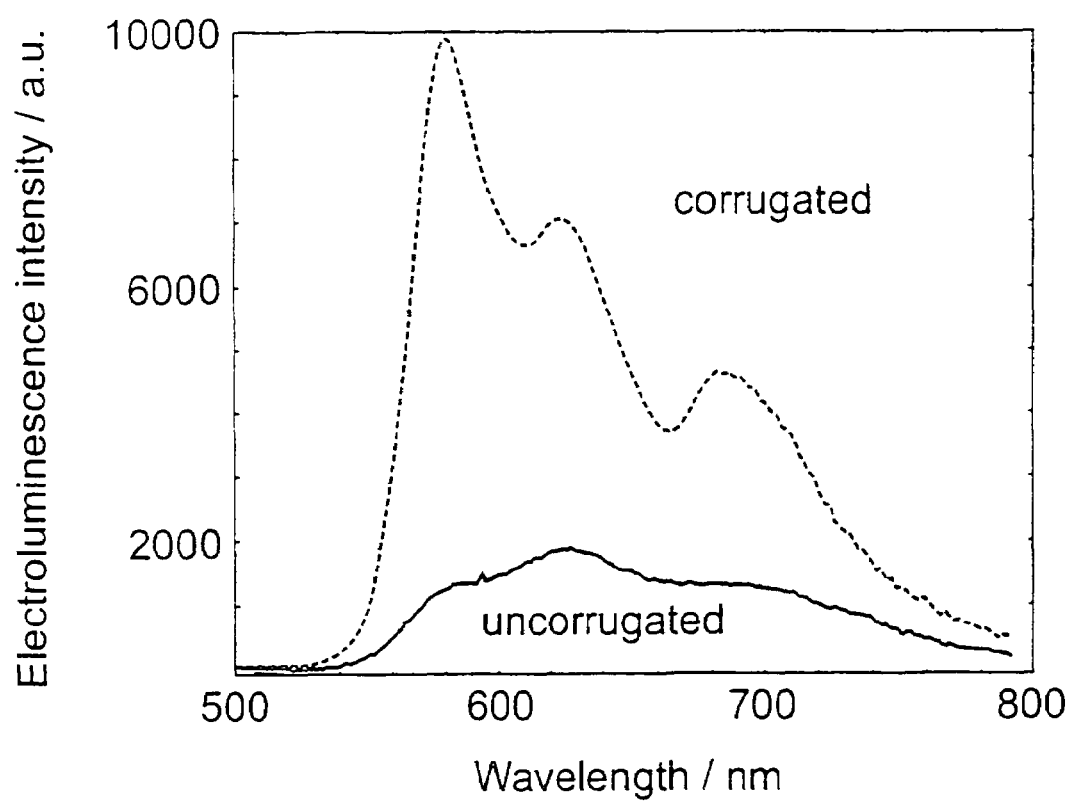
FIG. 4 shows the EL spectra measured at two adjacent pixels operating at the same bias and current.

FIG. 4 shows the EL spectra measured of two adjacent pixel operating at the same bias and current. The peak (at 620 nm) is increased by a factor of ~3.5 and the total area of the spectrum is increased by a factor of ~5 for the corrugated LED with respect to the uncorrugated LED. The peaks on the corrugated LED are resolved much more clearly, whereas the uncorrugated emission appears broadened. This figure demonstrates that the grating gives rise to an increase in external device efficiency and the variation of the emission spectrum (improvement of colour purity).

Figure 5:
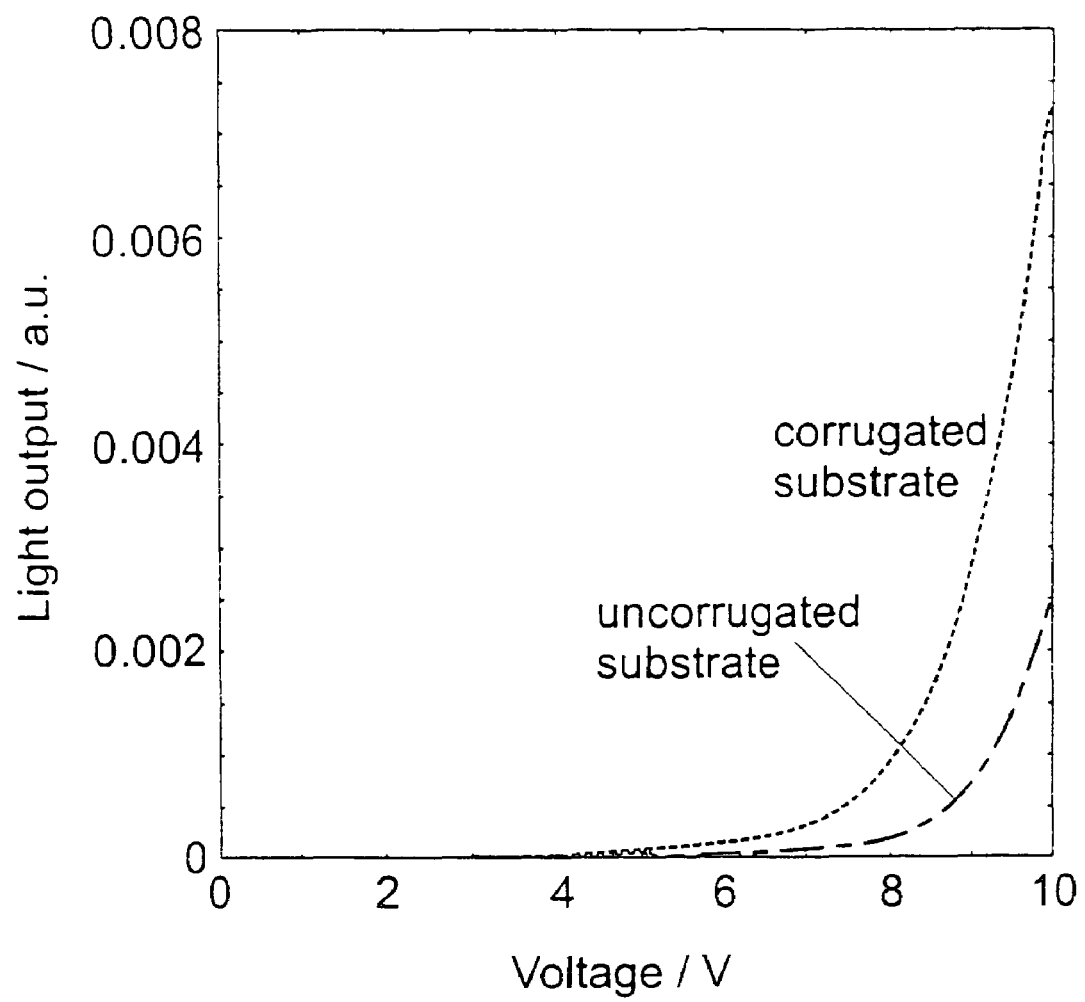
FIG. 5 is a graph of the light output of two pixels on corrugated and uncorrugated substrates.

In a separate experiment, the light output of two pixels on the corrugated and uncorrugated substrate was measured as a function of driving voltage. The results are shown in FIG. 5, and a substantial increase in the light output is obtained for the corrugated substrate. A standard analysis by taking into account the device current yields an external efficiency greater by a factor of ~2.5 for this example.

Figure 6:
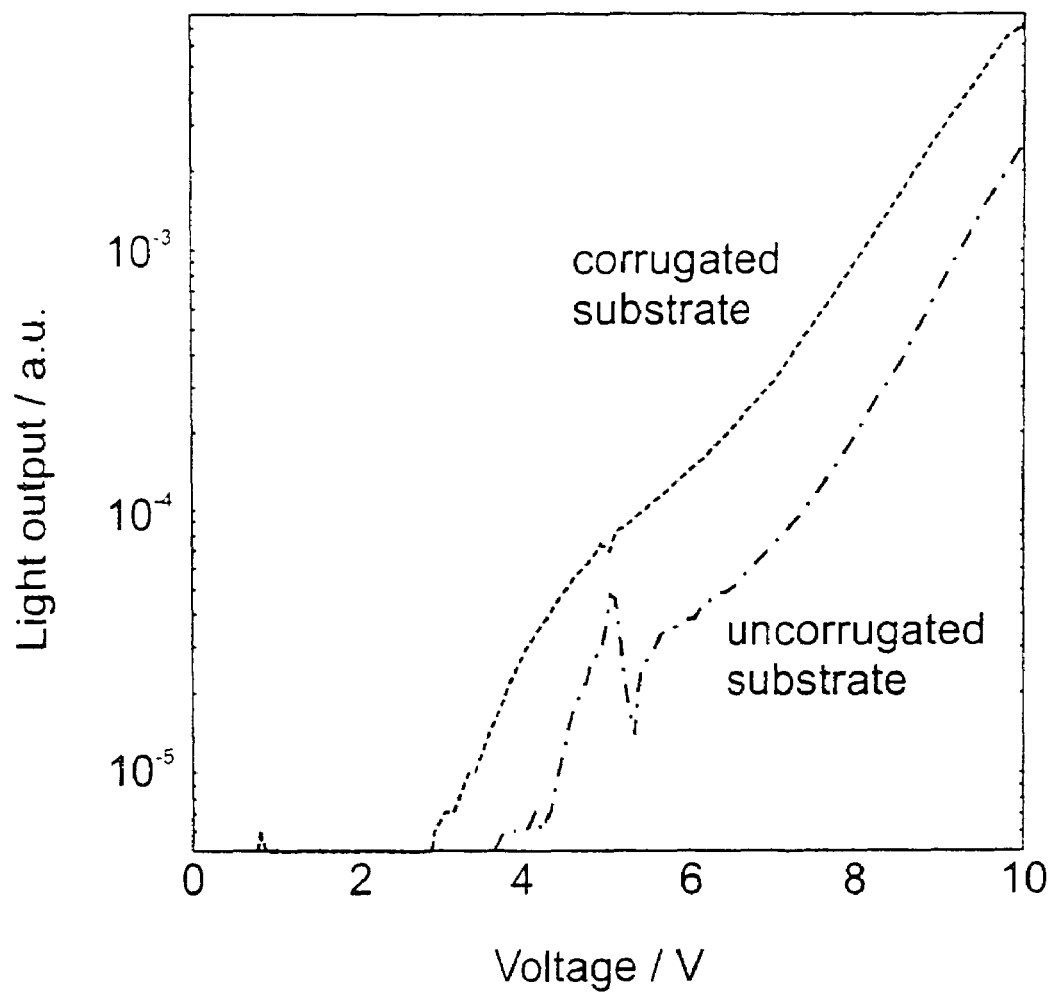
FIG. 6 is the graph of FIG. 5 on a logarithmic scale.

FIG. 6 shows the same graph on a logarithmic scale. It is clearly seen that both curves have a similar functional dependence on bias, indicating that a common electrical process gives rise to the electroluminescence (i.e. the injecting properties of the anode are apparently not modified significantly by the inclusion of the grating). The emission characteristic of the corrugated substrate is however increase by a factor of 2.5 with respect to the uncorrugated substrate. The ratio between the two curves is essentially constant between 4 and 10 V, which suggests the enhancement is indeed purely due to the effect of the grating on scattering out waveguide modes. The discontinuity in the characteristic of the uncorrugated substrate at 5 V is insignificant (due to the low level of light involved) and is most probably due to a minute electrical spark across the device.

Figure 7:
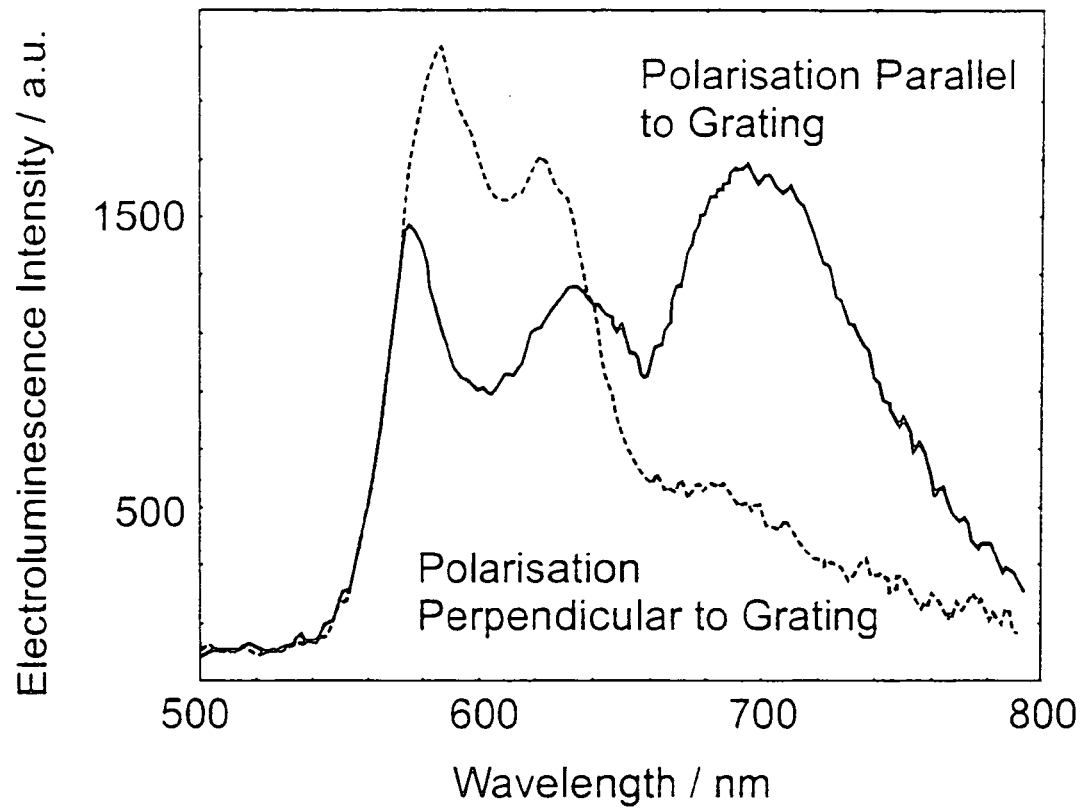
FIG. 7 is a graph depicting emitted light detected through polarizers.
Figure 8:
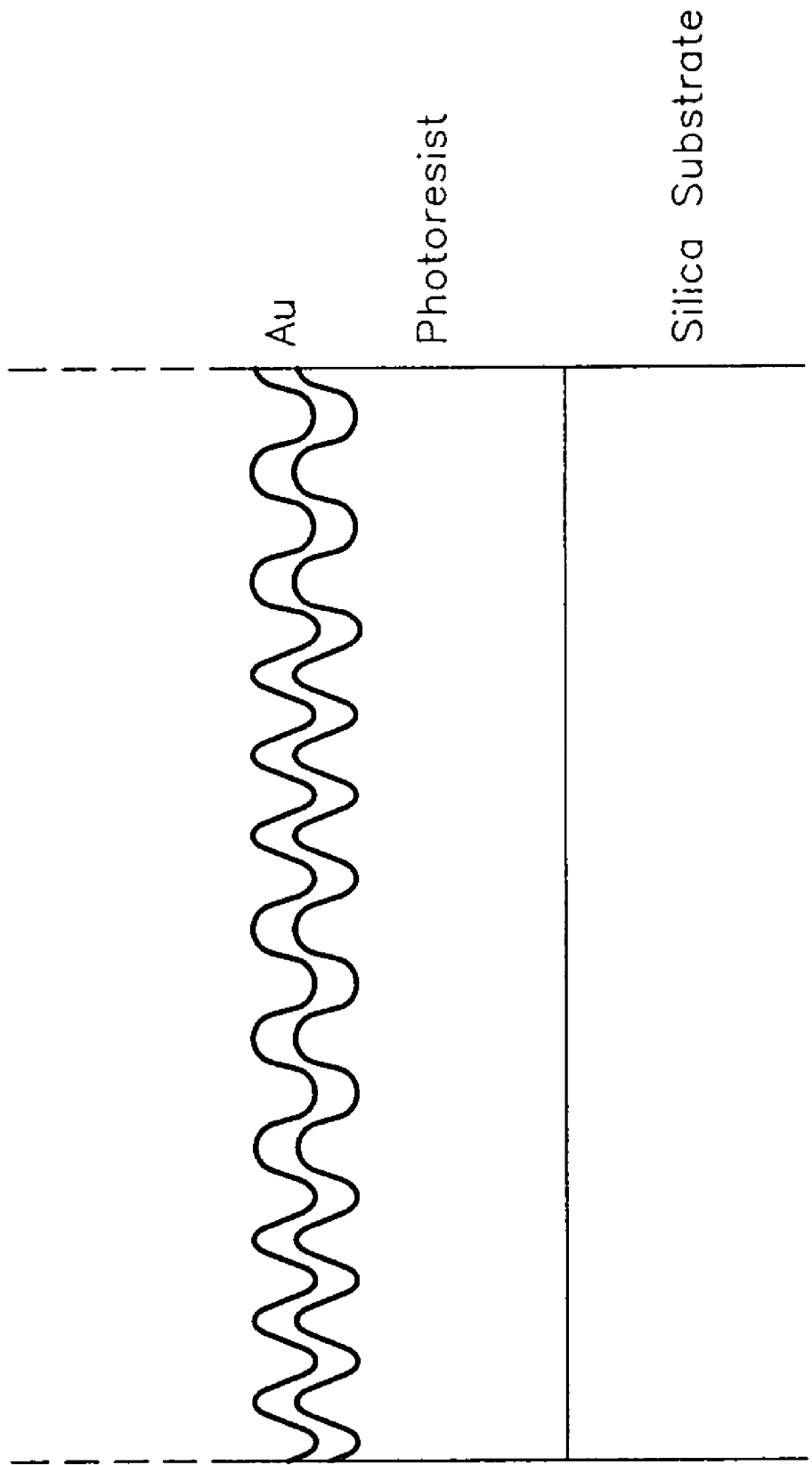
FIG. 8 is a partial cross-section similar to FIG. 2 (in part) but with regions of different periodicity.

Surface emitting LEDs generally emit unpolarised light. The results of an experiment to study the polarisation of the light emitted by a microstructured LED are shown in FIG. 7. The emitted light was detected through a polariser oriented either parallel or perpendicular to the direction of corrugation. A strong polarisation effect is observed for the corrugated LED. All three peaks in the electroluminescence spectrum display a polarisation dependence, the effect being strongest at the long wavelength peak. This is an extremely significant observation, as it demonstrates that polarised light emitted in the plane of the substrate is actually scattered out orthogonal to the substrate. It also demonstrates a means of fabricating a polarised EL device, which is of significant interest to LCD backlight applications.

(iv) General remarks

The corrugation is clearly visible at the top of the aluminium contacts through the entire device structure, which add up to a total thickness of ~400 nm. This demonstrates that the corrugation propagates throughout the LED and in particular through the polymer film, which gives rise to the efficiency enhancing scattering out of waveguide modes.

The main theoretical objection to the device structure presented in this example here has previously been the ratio between the emissive layer thickness and the depth of the corrugation, which are clearly comparable. It was thought that an unevenness of 80 nm would lead to a highly non-uniform field across the emissive layer of comparable thickness, which generally leads to localised heating and electrical breakdown through shorting of the device. Pinhole formation and unevenness in ITO (spikes resulting from the relatively crude sputtering process) have been a major problem in organic LEDs. In the above example, all devices were free of shorts despite the strong modulation of the anode surface profile.

What is claimed is:

1. A light-emitting diode (LED) comprising a plurality of layers overlying a transparent substrate, said substrate including a corrugated surface forming a grating, said layers including a transparent conductive anode overlying said corrugated surface, a light emitting layer overlying said conductive anode, and at least one electrode layer overlying said light emitting layer, wherein at least one of the layers overlying said corrugated surface of said substrate includes periodic microstructure means for manipulating spontaneous emission and propagation of light by coupling non-radiative waveguide modes to far-field radiation, at least one of the transparent conductive anode, the light emitting layer and the at least one electrode layer overlying the light emitting layer including a corrugated surface for manipulating spontaneous emission and propogation of light by coupling non-radiative waveguide modes to far-field radiation.

2. A LED as claimed in claim 1, wherein the microstructure means is generally lateral, such as to extend in a substantially parallel plane to one or more of said plurality of layers.

3. A LED as claimed in claim 1, wherein the microstructure means includes many regions of different periodicity to couple out light of different colours.

4. The LED of claim 1, wherein said substrate includes a photoresist layer having the corrugated surface.

5. The LED of claim 4, wherein said substrate includes a layer of silica on which said photoresist layer is disposed.

6. The LED of claim 1, wherein a conductive polymer layer is provided between the light emitting layer and the conductive anode.

7. The LED of claim 1, wherein the light emitting layer includes a light emitting polymer.

8. A LED as claimed in claim 1, wherein the microstructure means includes periodic corrugations of microscopic scale in the order of 100–600 nanometers.

9. A LED as claimed in claim 1, wherein the microstructure means includes periodic corrugations of microscopic scale in the order of 50–2000 nanometers.

10. A LED as claimed in claim 1, wherein at least one semiconducting layer, or a component thereof, is capable of light emission by luminescence.

11. A LED as claimed in claim 1, wherein the microstructure means is solid and includes one or more continuous microstructured layers.

12. A LED as claimed in claim 1, wherein the microstructure means provides the entirety of at least one of the plurality of layers.

13. A LED as claimed in claim 1, wherein the microstructure means is a diffraction grating.

14. A LED as claimed in claim 1, wherein the microstructure means comprises corrugations in the form of one or more non-planar surfaces or layers and comprises an array of opposed projecting portions.

15. A LED as claimed in claim 14 wherein the depth between corrugation peaks and troughs is of the order five to hundreds of nanometers.

16. A LED as claimed in claim 15 wherein the depth is between 10 and 200 nm.

17. A LED as claimed in claim 14 wherein the corrugations are in the entirety of said one or more layers.

18. A LED as claimed in claim 1, wherein the microstructure means comprises areas of modified refractive index.

19. A LED as claimed in claim 18 wherein the areas of portions modified refractive index are present within a layer and are in the form of lines or areas of modified refractive index laterally across the layer.

20. A LED as claimed in claim 1, further comprising at least one organic or organometallic semi-conducting layer.

21. A LED as claimed in claim 20 wherein the organic semi-conducting layer comprises a conjugated polymeric material.

22. A LED as claimed in claim 1, further comprising at least one inorganic semi-conducting layer.

23. A LED as claimed in claim 1, wherein the microstructure means includes periodic corrugations of microscopic scale in the order of 350–450 nanometers.

24. A LED as claimed in claim 1, wherein the microstructure means includes periodic corrugations of microscopic scale in the order of 400 nanometers.

25. A LED as claimed in claim 15 wherein the depth is between 20 and 120 nm.

26. A light-emitting diode (LED) comprising a plurality of layers overlying a silica substrate, said layers including a corrugated photoresist layer overlying said substrate to form a grating, a conducting anode overlying said photoresist layer, a conductive polymer overlying said conducting anode, an emissive layer overlying said conductive polymer, and at least one electrode layer overlying said emissive layer, wherein at least one of the layers overlying said photoresist layer includes periodic microstructure means for manipulating spontaneous emission and propagation of light by coupling non-radiative waveguide modes to far-field radiation.

27. The LED of claim 26 wherein said periodic microstructure means includes periodic corrugations.

28. A method for the production of a light emitting diode (LED), comprising the steps of fabricating a laminar structure including a plurality of layers overlying a transparent substrate, said substrate including a corrugated surface forming a grating, said step of fabricating including depositing a transparent conductive anode overlying said corrugated surface, depositing a light emitting layer overlying said conductive anode, and depositing at least one electrode layer overlying said light emitting layer, and further comprising the step of adapting the LED to include a corrugated surface in at least one of said transparent conductive anode, said light emitting layer and said at least one electrode layer, said corrugated surface manipulating spontaneous emission and propagation of light by coupling non-radiative waveguide-modes to far-field radiation.

29. The method of claim 28, wherein the adapting step comprises incorporating at least one semi-conducting organic layer with lateral periodic microstructure of suitable period to facilitate coupling of said layers.

30. The method of claim 29 wherein the semi-conducting organic layer is coated in a layer by means of spin coating, dip-coating, printing, evaporation or epitaxial growth.

31. The method of claim 28, wherein the microstructure means is produced by embossing, photolithography, microcontact printing or laser holography or by deposition on a microstructured substrate or microstructured contact.

32. The method of claim 31 wherein the microstructure means is created by exposing a photoresist layer to at least one laser beam.

33. The method of claim 32 wherein the microstructure means is then transferred from the photoresist layer to the substrate upon which it is supported.

* * * * *